United States Patent [19]

Taneya et al.

[11] Patent Number: 4,890,293
[45] Date of Patent: Dec. 26, 1989

[54] SEMICONDUCTOR LASER DEVICE

[75] Inventors: Mototaka Taneya, Tsukuba; Kosei Takahashi, Nara; Toshiro Hayakawa, Yokohama; Sadayoshi Matsui, Tenri; Mitsuhiro Matsumoto, Nara; Hiroyuki Hosoba, Tenri, all of Japan

[73] Assignee: Sharp Kabushiki Kaisha, Osaka, Japan

[21] Appl. No.: 255,049

[22] Filed: Oct. 7, 1988

[30] Foreign Application Priority Data

Oct. 8, 1987 [JP] Japan .................................. 62-254918

[51] Int. Cl.$^4$ ................................................ H01S 3/19
[52] U.S. Cl. ........................................... 372/46; 372/45
[58] Field of Search .............................. 572/43, 45, 46

[56] References Cited

U.S. PATENT DOCUMENTS 4,567,060  1/1986  Hayakawa et al. .................... 372/46
4,740,976  4/1988  Kajimura et al. ..................... 372/45

OTHER PUBLICATIONS

Appl. Phys. Lett., 47(12), Dec. 15, 1985, pp. 1239-1241.

Primary Examiner—William L. Sikes
Assistant Examiner—Georgia Y. Epps
Attorney, Agent, or Firm—Irell & Manella

[57] ABSTRACT

A semiconductor laser device comprising a first layer that is of a first conductivity type; a second layer that is disposed on the first layer, the second layer having a forbidden bandgap smaller than that of the first layer and having a refraction index larger than that of the first layer; a third layer that is of a second conductivity type; the third layer being disposed over the second layer, having a forbidden bandgap larger than that of the second layer, and having a refraction index smaller than that of the second layer; a fourth layer that functions as a quantum wall, the fourth layer being disposed between the second and third layers and the thickness of the fourth layer being the de Broglie's wavelength or less; and at least one striped mesa, the lower portion of which is constituted by the third layer, wherein the fourth layer has a forbidden bandgap that is larger than that of the energy of photons generated by the second layer, and moreover the fourth layer has the etching characteristics that are different from those of the third layer positioned just above the fourth layer.

2 Claims, 5 Drawing Sheets

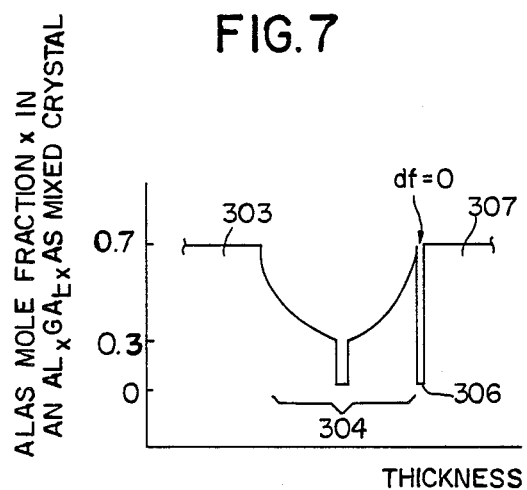
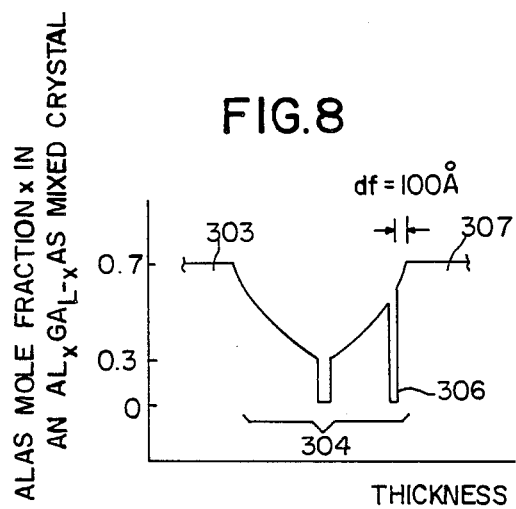

SEMICONDUCTOR LASER DEVICE

BACKGROUND OF THE INVENTION

1. Field of the Invention:

This invention relates to a semiconductor laser device and a method for the production of the laser device. More particularly, it relates to a semiconductor laser device with a small amount of ineffective current and a method for the production of the laser device.

2. Description of the Prior Art:

Semiconductor laser devices are widely used as a light source for optical disks and optical communication systems they will be used, for example, as a light source for laser printers and optical wiring. Quantum-well laser devices having a quantum well structure in the active region have a possible high electrical-optical conversion ratio (that is, a low threshold current) and a possible high frequency modulation, and it is expected that they will be used as optical devices in the future.

The main structures of the current-injection region and the light-confining region of such quantum-well lasers that are formed into a striped shape include the planar stripe structure, the buried heterostructure for which liquid phase epitaxy (LPE) is used, and the ridge guide structure.

However, each of these structure has the following disadvantages: With the planar stripe structure, the amount of ineffective current that flows outside of oscillation region is large. With the buried heterostructure, it is difficult to control the thickness of the buring layer, and the production yield is extremely poor. With the ridged guide structure, it is necessary that the control of the depth to which etching is done for the ridged shape be extremely precise. In these ways, it is difficult to build-in quantum-well lasers that have a structure with small amounts of ineffective current and satisfactory production yield by conventional methods.

To solve these problems, many attempts have been made to change the multiple quantum-well layers to an alloy layer by the use of impurity diffusion techniques or optical-anneal impurity implantation techniques, and to bring about radiation in the remaining quantum-well portion. For example, a method for the production of quantum-well layers using an Si diffusion technique has been published by R. L. Thornton in *Applied Physics Letters*, vol. 47, pp. 1239-1241 (1985). However, the resulting alloy layer has crystal defects which give undesirable effects on the lift span of the laser devices obtained.

Hayakawa et al. have developed and disclosed a method by which ridged guide structures can be made with satisfactory precision in U.S. Pat. No. 4,567,060. FIG. 11 shows a laser device that is produced by this method.

This laser device is produced as follows: First of all, on substrate 501, an n−$Al_xGa_{1-x}As$ cladding layer 502, an $Al_yGa_{1-y}As$ active layer 503, a p−$Al_xGa_{1-x}As$ first cladding layer 504, a p-GaAs etching-stop layer 505, a p−$Al_xGa_{1-x}As$ second cladding layer 506, and a p-GaAs contact layer 507 (x>y) are successively grown by either molecular beam epitaxy (MBE) or metal organic chemical vapor deposition (MO-CVD). The thickness of the etching-stop layer 505 is extremely thin, 200 Å or less. Thereafter, ridge 520 is formed by an etching technique. Because there is this etching stop layer 505 between the p-first cladding layer 504 and the p-second cladding layer 506, it is possible to control this etching so that it reaches only to the p-first cladding layer 504. Therefore, the thickness of the cladding layer outside of the ridge 520, which can give rise to ineffective current, depends upon the thickness $d_{3f}$ of the p-first cladding layer 504. Moreover, because the etching-stop layer 505 is only 200 Å, there is little superposition of light thereon, and it is possible to prevent the optical loss based on light absorbance at the etching-stop layer 505.

However, the inventors of this invention investigated further, and found that even when the thickness of the GaAs etching-stop layer 505 was set to be 200 Å or less, so long as light is absorbed by this etching-stop layer, the oscillation threshold current is 3–10 times that when there is no etching stop layer. Therefore, in this new kind of structure as well, improvement is still needed in view of the oscillation threshold current.

SUMMARY OF THE INVENTION

The semiconductor laser device of this invention, which overcomes the above-discussed and numerous other disadvantages and deficiencies of the prior art, comprises a first layer that is of a first conductivity type; a second layer that is disposed on said first layer, said second layer having a forbidden bandgap smaller than that of said first layer and having a refraction index larger than that of said first layer; a third layer that is of a second conductivity type, said third layer being disposed over said second layer, having a forbidden bandgap larger than that of said second layer, and having a refraction index smaller than that of said second layer; a fourth layer that functions as a quantum well, said fourth layer being disposed between said second and third layers and the thickness of said fourth layer being the de Broglie's wavelength or less; and at least one striped mesa, the lower portion of which is constituted by said third layer, wherein said fourth layer has a forbidden bandgap that is larger than that of the energy of photons generated by said second layer, and moreover said fourth layer has the etching characteristics that are different from those of said third layer positioned just above said fourth layer.

Another semiconductor laser device of this invention comprises a first layer that is of a first conductivity type; a second layer that is disposed on said first layer, said second layer having a forbidden bandgap smaller than that of said first layer and having a refraction index larger than that of said first layer; a third layer that is of a second conductivity type, said third layer being disposed over said second layer, having a forbidden bandgap larger than that of said second layer, and having a refraction index smaller than that of said second layer; a fourth layer that functions as a quantum well, said fourth layer being disposed inside of said second layer and the thickness of said fourth layer being the de Broglie's wavelength or less; and at least one striped mesa, the lower portion of which is constituted by said third layer, wherein said fourth layer has a forbidden bandgap that is larger than that of the energy of photons generated by said second layer, and moreover said fourth layer has the etching characteristics that are different from those of said second layer positioned just above said fourth layer.

The method for the production of semiconductor laser devices of this invention comprises selectively etching said third layer so that said fourth layer is exposed to the outside, resulting in said striped mesa, wherein said third layer is etched at a rate that is 10 times or more the rate at which said fourth layer is etched.

Another method for the production of semiconductor laser devices of this invention comprises selectively etching said second layer so that said fourth layer is exposed to the outside, resulting in said striped mesa, wherein said second layer is etched at a rate that is 10 times or more the rate at which said fourth layer is etched.

Thus, the invention described herein makes possible the objectives of (1) providing a semiconductor laser device that attains laser oscillation at a low threshold current level; (2) providing a semiconductor laser device that gives rise to no ineffective current; (3) providing a semiconductor laser device that is produced with high yields; and (4) providing a method for the production of the above-mentioned laser device.

BRIEF DESCRIPTION OF THE DRAWINGS

This invention may be better understood and its numerous objects and advantages will become apparent to those skilled in the art by reference to the accompanying drawings as follows:

FIG. 7 is of a graph showing the AlAs mole fraction (i.e.,x) in an $Al_xGa_{1-x}As$ mixed crystal in the active region of another semiconductor laser device of this invention.

FIG. 8 is of a graph showing the AlAs mole fraction (i.e.,x) in an $Al_xGa_{1-x}As$ mixed crystal in the active region of the another semiconductor laser device of this invention.

DESCRIPTION OF THE PREFERRED EMBODIMENTS

Example 1

Figure 1A:
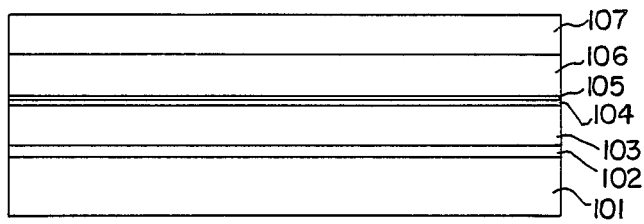
FIGS. 1a and 1b are schematic diagrams showing the production process of a semiconductor laser device of this inventions.
Figure 2:
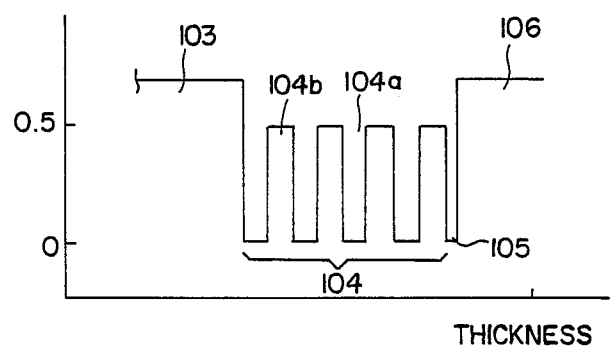
FIG. 2 is a graph showing the AlAs mole fraction (i.e., x) in an $Al_xGa_{1-x}As$ mixed crystal in the active region of the semiconductor laser device shown in FIG. 1b.

A semiconductor laser device of this invention, which comprises a first layer (i.e., an $n-Al_yGa_{1-y}As$ cladding layer 103), a second layer (i.e., an undoped multiple quantum-well active layer 104), a third layer (i.e., a $p-Al_yGa_{1-y}As$ cladding layer 106), and a fourth layer (i.e., a p-GaAs etching-stop layer 105), was produced as follows: As shown in FIG. 1a, first, an n-GaAs substrate 101, an $n-Al_xGa_{1-x}As$ (x=0→0.5) buffer layer 102 with a thickness of 0.2 μm wherein the value of x is gradually changed from 0 to 0.5; that is paid buffer layer has a gradient AlAs mole fraction, an $n-Al_yGa_{1-y}As$ cladding layer 103 with a thickness of 1.5 μm, an undoped multiple quantum-well active layer 104, a p-GaAs etching-stop layer 105 with a thickness of 20 Å, a $p-Al_yGa_{1-y}As$ cladding layer 106 with a thickness of 1.2 μm, and a p-GaAs contact layer 107 with a thickness of 1.0 μm were successively grown by either molecular beam epitaxy (MBE) or metal-organic chemical vapor deposition (MO-CVD). As shown in FIG. 2, the active layer 104 was composed of alternate layers consisting of four GaAs quantum-well layers 104a with a thickness of 70 Å each and four $Al_{0.5}Ga_{0.5}As$ barrier layers 104b with a thickness of 100 Å each. The AlAs mole fraction (i.e., y) of each of the cladding layers 103 and 106 was set to be 0.7 (i.e., y=0.7).

Figure 1B:
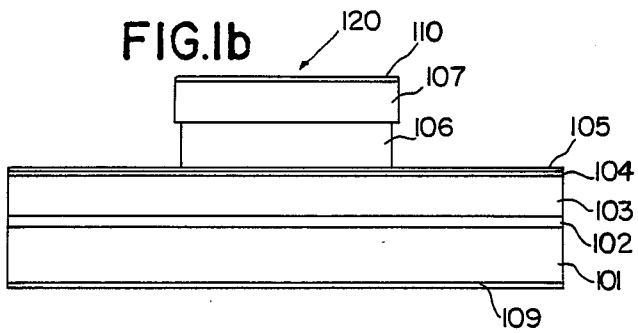

Then, by photolithography and etching techniques, a striped mesa 120 with a width of 3 μm was formed so that the $p-Al_yGa_{1-y}As$ cladding layer 106 was exposed to the outside. The etchant used herein was a mixture of $H_2SO_4$, $H_2O_2$, and $H_2O$ at the proportions of 2:4:100. Thereafter, the $p-Al_yGa_{1-y}As$ cladding layer 106 was selectively etched by an HF buffer solution. This process was carried out with the inventor's knowledge that the GaAs etching-stop layer 105 with a thickness of 20 Å (a four molecules thick) was not etched by the HF buffer solution. Then, a p-side ohmic electrode 110 and an n-side ohmic electrode 109 were formed on the top surface of the mesa 120 and the bottom surface of the substrate 101, respectively, followed by cleaving the wafer, resulting in a semiconductor laser device shown in FIG. 1b.

The cladding layer 106 has a forbidden bandgap that is larger than that of the active layer 104. The etching-stop layer 105 has a forbidden bandgap that is larger than that of the energy of photons generated by the active layer 104. The cladding layer 106 is etched at a rate that is 10 times or more the rate at which the etching-stop layer 105 is etched. The thickness of the etching-stop layer 105 is the de Broglie's wavelength or less.

The above-mentioned semiconductor laser device oscillates laser in the multiple quantum-well active layer 104 at a wavelength of 820 nm (which corresponds to energy conversion of 1.51 eV). Because the thickness of the p-GaAs etching-stop layer 105 that is positioned below the mesa 120 is as extremely thin as of 20 Å, its forbidden bandgap becomes about 1.81 eV because of the quantum effect, and becomes permeable overall to the oscillating light. That is, this etching-stop layer 105 has an advantage that none of the oscillating light is absorbed, in addition to the advantage shown by Hayakawa et al., that the said layer has no bad effects on the optical characteristics of the laser device. Thus, this laser device performs functions which are equivalent to those of laser devices with a ridged guide structure that are etched directly above the active layer 104, ideally. The oscillation threshold current of this laser device was 12-16 mA, and the differential quantum efficiency thereof was 70-80%. In this way, semiconductor laser devices in which the ineffective current is suppressed at the minimum level can be produced with satisfactory yields.

Example 2

Figure 3:
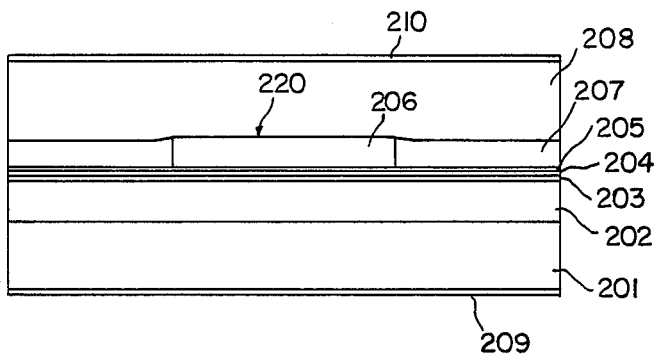
FIG. 3 is a sectional view showing another semiconductor laser device of this invention.
Figure 4:
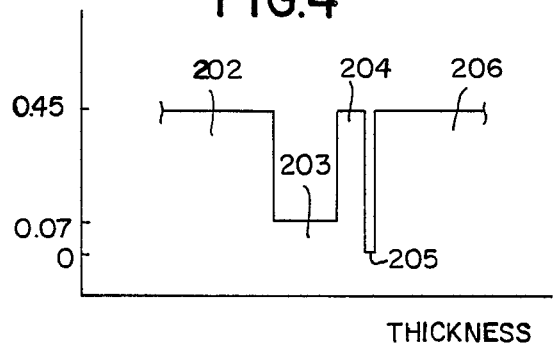
FIG. 4 is of a graph showing the AlAs mole fraction (i.e.,x) in an $Al_xGa_{1-x}As$ mixed crystal in the active region of the semiconductor laser device shown in FIG. 3.

FIG. 3 shows another semiconductor laser device of the planar type of this invention, which comprises a first layer (i.e., an n—$Al_{0.45}Ga_{0.55}As$ cladding layer 202), a second layer (i.e., a p—or n—$Al_{0.07}Ga_{0.93}As$ active layer 203), a third layer (i.e., a p—$Al_{0.45}Ga_{0.55}As$ cladding layer 206), and a fourth layer (i.e., a p-GaAs etching-stop layer 205). This laser device was produced as follows: First, on an n-GaAs substrate 201, an n—$Al_{0.45}Ga_{0.55}As$ cladding layer 202 with a thickness of a p—or n—$Al_{0.07}Ga_{0.93}As$ active layer 203 with a thickness of 0.08 μm, a p—$Al_{0.45}Ga_{0.55}As$ carrier-barrier layer 204 with a thickness of 0.05 μm, a p-GaAs etching-stop layer 205 with a thickness of 15 Å, and a p—$Al_{0.45}Ga_{0.55}As$ cladding layer 206 with a thickness of 1.1 μm were successively grown. FIG. 4 shows the distribution of the AlAs mole fraction of the mixed crystals in the longitudinal directions.

Thereafter, in the same way as the example given above, a striped mesa 220 with a width of 3 μm was selectively formed by an etching technique. The HF buffer solution was used to etch the p—$Al_{0.45}Ga_{0.55}As$ cladding layer 206, as well, that is positioned just above the p-GaAs etching-stop layer 205. Then, an n—$Al_{0.55}Ga_{0.45}As$ current blocking layer 207 with a thickness of 1.0 μm was grown outside of the mesa 220 by LPE, after which a p-GaAs contact layer 208 with a thickness of 3.0 μm thick was grown on the entire surface of the wafer. Finally, a p-side ohmic electrode 210 and an n-side ohmic electrode 209 were formed on the entire surface of the contact layer 208 and the bottom surface of the substrate 201, respectively, followed by clearing the wafer, resulting in a semiconductor laser device with a cavity length of 250 μm.

The cladding layer 206 has a forbidden bandgap that is larger than that of the active layer 203. The etching-stop layer 205 has a forbidden gap that is larger than that of the energy of photons generated by the active layer 203. The cladding layer 206 is etched at a rate that is 10 times or more the rate at which the etching-stop layer 205 is etched. The thickness of the etching-stop layer 205 is the de Broglie's wavelength or less.

In this example, the active layer 203 does not have a quantum effect, and the oscillation wavelength is 820 nm (which corresponds to energy conversion of 1.51 eV). On the contrary, the energy forbidden bandgap of the etching-stop layer 205 becomes 1.80 eV because of the quantum effect, so that the oscillation wavelength is large enough. For that reason, light absorbance does not arise at this etching-stop layer 205. Accordingly, optical loss by light absorbance inside of the laser device results in the same as that of a laser device in which there is no etching-stop layer 205. Moreover, there is a difference between the AlAs mole fraction of mixed crystals in the p—$Al_{0.45}Ga_{0.55}As$ cladding layer 206 and that of mixed crystals in the n—$Al_{0.55}Ga_{0.45}As$ current blocking layer 207, so light is confined into the portion directly below the mesa 220. As a result, the distribution of the light and the distribution of the injected carrier overlap completely, which makes it possible to generate light with high efficiency. The oscillation threshold current was 15–17 mA, and the differential quantum efficiency was 75%.

Example 3

Figure 5A:
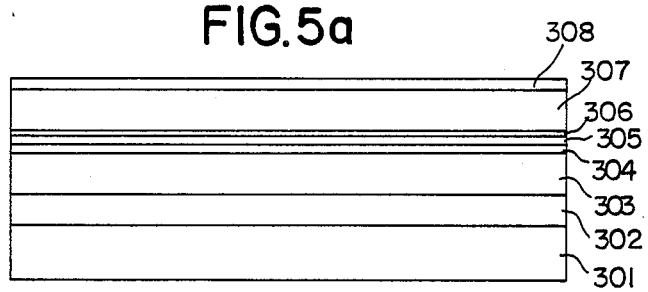
FIGS. 5a and 5b are schematic diagrams showing the production process of another semiconductor laser device of this invention.
Figure 5B:
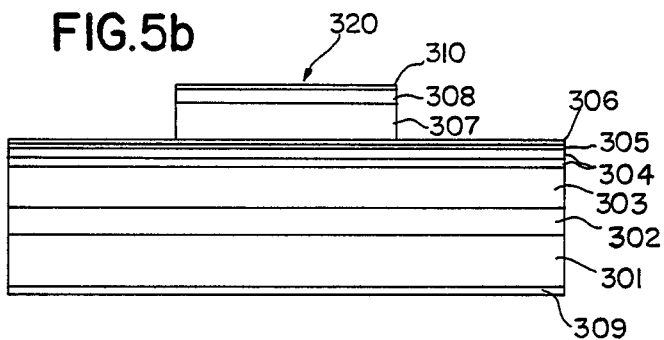
Figure 6:
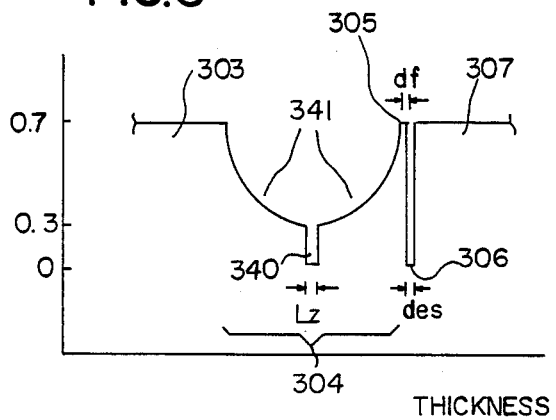
FIG. 6 is of a graph showing the AlAs mole fraction (i.e.,x) in an $Al_xGa_{1-x}As$ mixed crystal in the active region of the semiconductor laser device shown in FIG. 5b.

FIG. 5b shows another semiconductor laser device of this invention with a graded index-separate confinement heterostructure (GRIN-SCH) type for the active layer. This laser device comprises a first layer (i.e., an n—$Al_{0.7}Ga_{0.3}As$ cladding layer 303), a second layer (i.e., an undoped GRIN-SCH-type $Al_xGa_{1-x}As$ active layer 304), a third layer (i.e., a p—$Al_{0.7}Ga_{0.3}As$ cladding layer 307), and a fourth layer (i.e., a p-GaAs etching-stop layer 306). This laser device is produced as follows:

As shown in FIG. 5a, first, on an n-GaAs substrate 301, a superlatticed buffer layer 302 with a thickness of 0.2 μm, an n—$Al_{0.7}Ga_{0.3}As$ cladding layer 303 with a thickness of 1.1 μm, an undoped GRIN-SCH-type $Al_xGa_{1-x}As$ active layer 304 with a thickness of 0.3 μm, a p—$Al_{0.7}Ga_{0.3}As$ carrier-barrier layer 305 with a thickness of 0.02 μm, a p-GaAs etching-stop layer 306 with a thickness of 25 Å (the thickness thereof is shown in FIG. 6 as $d_{es}$), a p—$Al_{0.7}Ga_{0.3}As$ cladding layer 307 with a thickness of 2.0 μm, and a p+-GaAs contact layer 308 with a thickness of 0.5 μm were successively grown. FIG. 6 shows the AlAs mole fraction distribution of mixed crystals in the vicinity of the GRIN-SCH region, in which when the distance $d_f$ between the upper edge of the active layer 304 and the lower edge of the etching-stop layer 306 is the thickness of the carrier-barrier layer 305, which is 0.02 μm. A single quantum-well structure 340 was formed between the GRIN regions 341 of the active layer 340. The width $L_z$ of the quantum well 340 was set to be 70 Å. The oscillation wavelength was 830 nm. In the same way as the examples above, light absorbance does not arise at the etching-stop layer 306 because of the quantum effect.

Then, a mesa 320 with a width of 2 μm was formed by the use of an ammonia-type etchant and a hydrofluoric acid-type etchant in this order. The mesa 320 was composed of the p+-GaAs contact layer 308 and the p—$Al_{0.7}Ga_{0.3}As$ cladding layer 307. Etching by means of the hydrofluoric acid-type etchant was stopped by the p-GaAs etching-stop layer 306, so the portion, which causes the current diffusion within the laser device, resulting in an injection of carrier into the active layer 304 with the GRIN regions 341, involves only these two layers: the p—$Al_{0.7}Ga_{0.3}As$ carrier-barrier layer 305 with a thickness of 200 Å and the p-GaAs etching-stop layer 306 with a thickness of 25 Å, which is the de Broglie's wavelength or less. However, because the thicknesses of these two layers 305 and 306 are thin, there is almost no occurrence of ineffective current. Finally, a p-side ohmic electrode 310 and an n-side ohmic electrode 309 were formed on the top surface of the mesa 320 and the bottom surface of the substrate 301, respectively, followed by cleaving the wafer, resulting in a semiconductor laser device shown in FIG. 5b. The cladding layer 307 has a forbidden bandgap that is larger than that of the active layer 304. The etching-stop layer 306 has a forbidden bandgap that is larger than that of the energy photons generated by the active layer 304. The cladding layer 307 is etched at a rate that is 10 times or more the rate at which the etching-stop layer 306 is etched. The oscillation threshold current of this laser device was 3–5 mA. In this way, by the selective etching of the p—$Al_{0.7}Ga_{0.3}As$ cladding layer 307, it is possible to obtain laser devices with a low oscillation threshold current level in good yield.

Example 4

Although Example 3 discloses a laser device having a p—$Al_{0.7}Ga_{0.3}As$ carrier-barrier layer 305 with a thickness of 0.02 μm(i.e., $d_5$=0.02 μm), in order to attain a further decrease in the ineffective current, as shown in FIG. 7, the carrier-barrier laser 305 need not be provided (that is, $d_f=0$). Or, as shown in FIG. 8, the etching-stop layer 306 can be provided within the active layer 304 (in other words, $d_f$ will be minus; for example, $d_f = -100$ Å). In these situations, the ineffective current will be decreased if the etching-stop layer 305 is formed of undoped GaAs, whereby still better characteristics will be obtained.

Example 5

Figure 9:
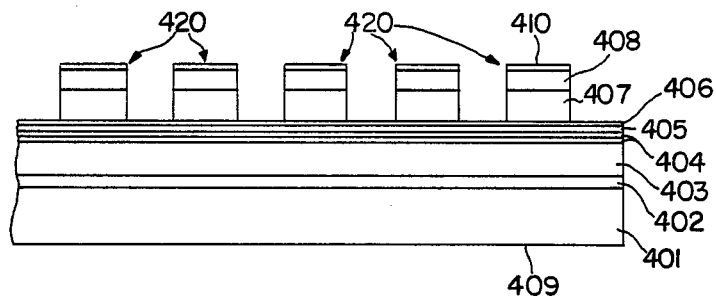
FIG. 9 is a sectional view showing another semiconductor laser device of this invention.
Figure 10:
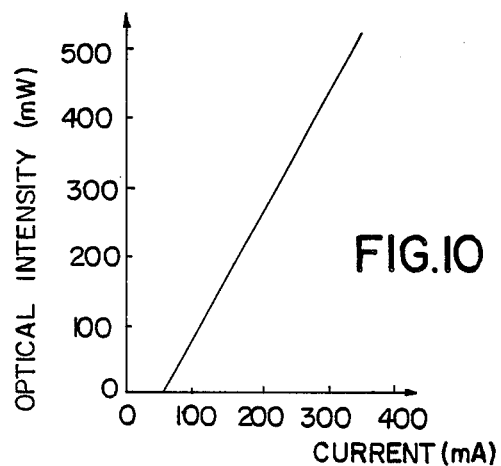
FIG. 10 is of a graph showing the relationship between the current and the optical intensity with regard to the semiconductor laser device shown in FIG. 9.
Figure 11:
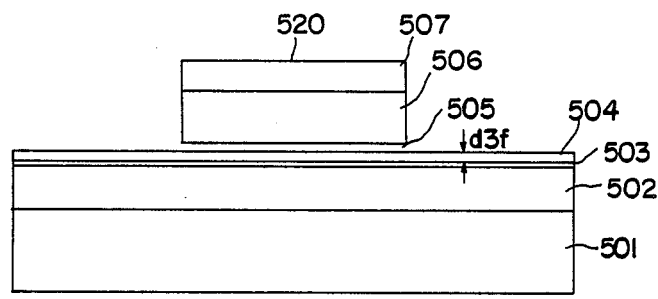
FIG. 11 is a sectional view showing a conventional semiconductor laser device.

FIG. 9 shows another semiconductor laser device of this invention in which the GRIN-SCH structure described above is applied to a semiconductor laser array device. The alloy device of this example is the same as the example shown in FIG. 5 in the growth of its layers and the structure of its electrodes, with the exception of the structures that are described below. For portions that are the same, the reference numerals used to explain this example will have their first digit changed from 3 to 4 (for example, the reference numeral of the active layer will be 404) and the description will be omitted. In this array device, by the etching process that is the same as in the example given before, twenty striped mesas 420 were formed in a parallel manner with a pitch of 5 μm. In order to attain a synchronized optical-phase between the adjacent lasing filaments, the thickness of the p—$Al_{0.7}Ga_{0.3}As$ carrier-barrier layer 405 was set to be 0.1 μm (that is, $d_f=0.1$ μm). The characteristics of the current and optical output of this array device are shown in FIG. 10. The oscillation threshold current was 65–80 mA, and the differential quantum efficiency was 80%.

With this kind of semiconductor laser array devices, if the value of $d_f$ is set to be zero, the width of the mesa is 2–4 μm, the pitch of the mesa is 7–100 μm, and individual lasing filaments have electrodes, then it is possible for each laser to oscillate individually.

This invention is not limited to the examples given above, but can be also applied when:

1. materials other than those used for the construction of lasers are used (for example, InGaAlP systems and the like),
2. The conductivity type of the crystal layers is different from that of the crystal layers used in the above-mentioned examples,
3. other liquids or gases are used for etching,
4. a different shape of the waveguide is used,
5. crystals are regrown on the area where etching has been done, and current flows only through this area,
6. the mesa width is 0.01–100 μm,
7. for array devices, the mesa period is 0.02–100 μm,
8. the thickness (or $d_f$) of the carrier-barrier layer is $-0.15$–0.4 μm, and
9. the etching-stop layer is made of an undoped semiconductor layer.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device with an active layer for laser oscillation, the combination of a first layer that is of a first conductivity type; a second layer that is disposed as said active layer on said first layer, said second layer having a forbidden bandgap smaller than that of said first layer and having a refraction index larger than that of said first layer; a third layer that is of a second conductivity type, said third layer being disposed over said second layer, having a forbidden bandgap larger than that of said second layer, and having a refraction index smaller than that of said second layer; a fourth layer that functions as a quantum well, said fourth layer being disposed between said second and third layers and the thickness of said fourth layer being the de Broglie's wavelength or less; and at least one striped mesa, the lower portion of which is constituted by said third layer, wherein said fourth layer has a forbidden bandgap that is larger than that of the energy of photons generated by said second layer, and moreover said fourth layer is formed from a material with an etching rate different from that of a material from which said third layer positioned just above said fourth layer is formed.

2. In a semiconductor laser device with an active layer for laser oscillation, the combination of a first layer that is of a first conductivity type; a second layer that is disposed as said active layer on said first layer, said second layer having a forbidden bandgap smaller than that of said first layer and having a refraction index larger than that of said first layer; a third layer that is of a second conductivity type, said third layer being disposed over said second layer, having a forbidden bandgap larger than that of said second layer, and having a refraction index smaller than that of said second layer; a fourth layer that functions as a quantum well, said fourth layer being disposed inside of said second layer and the thickness of said fourth layer being the de Broglie's wavelength or less; and at least one striped mesa, the lower portion of which is constituted by said third layer, wherein said fourth layer has a forbidden bandgap that is larger than that of the energy of photons generated by said second layer, and moreover said fourth layer is formed from a material with an etching rate different from that of a material from which said second layer positioned just above said fourth layer is formed.

* * * * *